United States Patent
Fang et al.

(10) Patent No.: US 10,823,776 B2
(45) Date of Patent: Nov. 3, 2020

(54) TESTING FIXTURE

(71) Applicant: Siliconware Precision Industries Co., Ltd., Taichung (TW)

(72) Inventors: Bo-Siang Fang, Taichung (TW); Cheng-Tsai Hsieh, Taichung (TW); Kuan-Ta Chen, Taichung (TW); Ying-Wei Lu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 70 days.

(21) Appl. No.: 16/408,389

(22) Filed: May 9, 2019

(65) Prior Publication Data

US 2020/0072886 A1 Mar. 5, 2020

(30) Foreign Application Priority Data

Sep. 5, 2018 (TW) .............................. 107131135 A

(51) Int. Cl.
*G01R 29/10* (2006.01)
*H04B 17/29* (2015.01)
*H01Q 3/26* (2006.01)
*H04B 17/10* (2015.01)

(52) U.S. Cl.
CPC ............. *G01R 29/10* (2013.01); *H01Q 3/267* (2013.01); *H04B 17/101* (2015.01); *H04B 17/29* (2015.01)

(58) Field of Classification Search
CPC .. G01R 29/10; G01R 29/105; G01R 29/0821; G01R 29/0835; H01Q 3/267; H04B 17/29; H04B 17/10; H04B 17/101; H04B 17/15
See application file for complete search history.

(56) References Cited

U.S. PATENT DOCUMENTS

| | | | |
|---|---|---|---|
| 2011/0102275 A1* | 5/2011 | Partee | G01R 29/105 343/703 |
| 2011/0102276 A1* | 5/2011 | Jimenez | G01R 29/10 343/703 |
| 2012/0268153 A1* | 10/2012 | Nickel | G01R 31/3025 324/754.31 |
| 2018/0183150 A1* | 6/2018 | Sienkiewicz | H01Q 13/18 |

* cited by examiner

*Primary Examiner* — Thai Pham
(74) *Attorney, Agent, or Firm* — Mintz Levin Cohn Ferris Glovsky and Popeo, P.C.; Peter F. Corless; Steven M. Jensen

(57) ABSTRACT

A testing fixture used in an antenna testing process is provided. A cover unit having a second antenna portion is arranged on a base unit configured for an electronic structure having a first antenna portion to be placed thereon. The cover unit includes a non-metal interposing portion configured for pressing the electronic structure to separate the second antenna portion from the first antenna portion. Therefore, when the antenna testing process is performed on the electronic structure, a metal shielding effect is avoided, and an over the air testing environment is provided.

15 Claims, 5 Drawing Sheets

TESTING FIXTURE

This Application claims the benefit of Taiwanese Application No. 107131135 filed on Sep. 5, 2018. The entire contents of this application is incorporated herein by reference in their entirety.

BACKGROUND

1. Technical Field

The present disclosure relates to testing fixtures, and, more particularly, to a testing fixture used in an over the air (OTA) testing operation.

2. Description of the Prior Art

The current communication transmission is in the fourth generation (4G) stage, but with the rapid development of wireless communication and the increasing network traffic, the required wireless transmission bandwidth is also increasing. Therefore, the fifth generation (5G) communication transmission R&D is about to come to the market. The target frequency band of the highest frequency of the 5G system is the millimeter wave band (mm Wave), and its frequency ranges from 28 GHz to 52.6 GHz (3gpp R15), and even up to 73 GHz.

Compared with the current 4G antenna testing, which is performed on a system end (such as mobile phones, tablets, etc.), in the 5G stage, the antenna testing needs to be performed on the packaging and testing end because antenna design is changed to the AiP (Antenna in Package) package design in the mm Wave band field.

However, in the packaging and testing stage, no exposed antenna contact is between the die-to-be-tested and the antenna for the packaging and testing end to perform contacting measurement for antenna testing. In the current packaging and testing factory, an electric testing device is adopted, which uses a metal fixture to press down the die-to-be-tested. However, the metal fixture generates a metal shielding effect, making the antenna cannot be tested.

Furthermore, the size of metal fixture is different from the size required for antenna testing, making the standard distance between the antenna on the die-to-be-tested and the test antenna of the metal fixture (need to meet the far field conditions) inconsistent. The testing distance for 5G frequency band, which is over 28 GHz, which is also different from the 4G frequency band, which is below 6 GHz.

Moreover, a general packaging and testing factory uses only one fixture to conduct all electrical tests. However, due to the increased needs for antenna testing in the packaging and testing stage, the testing environment is changed to over the air (OTA) test environment, which is more strict than other electrical tests.

Therefore, designing a testing fixture that can be adapted to the OTA test environment to meet the antenna test requirements and is also compatible with other electrical test requirements is becoming an urgent issue in the art.

SUMMARY

In view of the drawbacks of the prior art, the present invention provides a testing fixture, comprising: a base unit including a placing region for an electronic structure having a first antenna portion to be placed therein and a conductive portion arranged in the placing region and configured for being electrically connected to the electronic structure; and a cover unit disposed on the base unit and including a second antenna portion associated with the first antenna portion in position and an interposing portion configured for separating the second antenna portion and the first antenna portion, the interposing portion being made of a non-metal material.

In an embodiment, a dielectric constant of the interposing portion is within 1 to 3.2.

In an embodiment, the cover unit has a concave portion corresponding to the electronic structure. For example, the concave portion of the interposing portion corresponds to the first antenna portion of the electronic structure in position.

In an embodiment, the cover unit presses a whole top surface of the electronic structure.

In an embodiment, the cover unit includes a plate body arranged with the second antenna portion and an interposing body bonded to the plate body and arranged with the interposing portion. For example, the plate body is bonded via an adhesive material to the interposing body.

In an embodiment, the second antenna portion is in communicative connection with an external electronic device. For example, the cover unit further includes a switching element electrically connected to the second antenna portion, the second antenna portion is in communicative connection with the external electronic device via the switching element, and the switching element provides a signal transmission with a stable phase and a stable magnitude.

In an embodiment, the testing fixture further comprises an externally connectible member detachably disposed on the cover unit and configured for an environment member to be connected thereto externally.

In an embodiment, a height of the interposing portion has is associated with a width and a testing bandwidth of the electronic structure.

In an embodiment, the cover unit is disposed on the base unit via a positioning structure, and a relative position between the cover unit and the base unit after being positioned is associated with a width and a testing bandwidth of the electronic structure.

In an embodiment, the base unit includes: a circuit board; and a seat body disposed on the circuit board, arranged with the placing region and the conductive portion, and configured for the cover unit to be bonded thereto, and the conductive portion is elastically, electrically connected to the electronic structure and the circuit board. For example, the seat body is formed with a groove to act as the placing region, and the conductive portion is arranged in a bottom portion of the groove.

In an embodiment, the conductive portion is a probe structure.

It is known from the above that in the testing fixture according to the present invention, a cover unit is disposed on the base unit to perform an OTA antenna testing process and an electric testing process as well. Compared with the prior art, the testing fixture according to the present invention can meet the multiple-function testing requirement, and save the cost of the testing equipment.

In the testing fixture according to the present invention, through the design of the positioning structure and the adjustment of the height of the interposing portion, the measurement result can have repetitiveness and reproducibility.

Since the interposing portion of the testing fixture is made of a non-metal material, a metal shielding effect will not occur while the interposing portion presses the electronic structure.

BRIEF DESCRIPTION OF THE DRAWINGS

The invention can be more fully understood by reading the following detailed description of the preferred embodiments, with reference made to the accompanying drawings, wherein.

DETAILED DESCRIPTION

The following illustrative embodiments are provided to illustrate the disclosure of the present invention, these and other advantages and effects can be apparently understood by those in the art after reading the disclosure of this specification.

It should be appreciated that the structures, proportions, size and the like of the figures in the present application are intended to be used in conjunction with the disclosure of the specification. They are not intended to limit the invention and therefore do not represent any substantial technical meanings. The details of the specification may be on the basis of different points and applications, and numerous modifications and variations can be devised without departing from the spirit of the present invention. As used herein, the terms "first," "second,", "a" and the like, are used to distinguish one element from another, and are not intended to limit the scope of the present application. Changes or adjustments are considered to be within the scope of the present invention, without departing from the scope of the present invention.

Figure 1A:
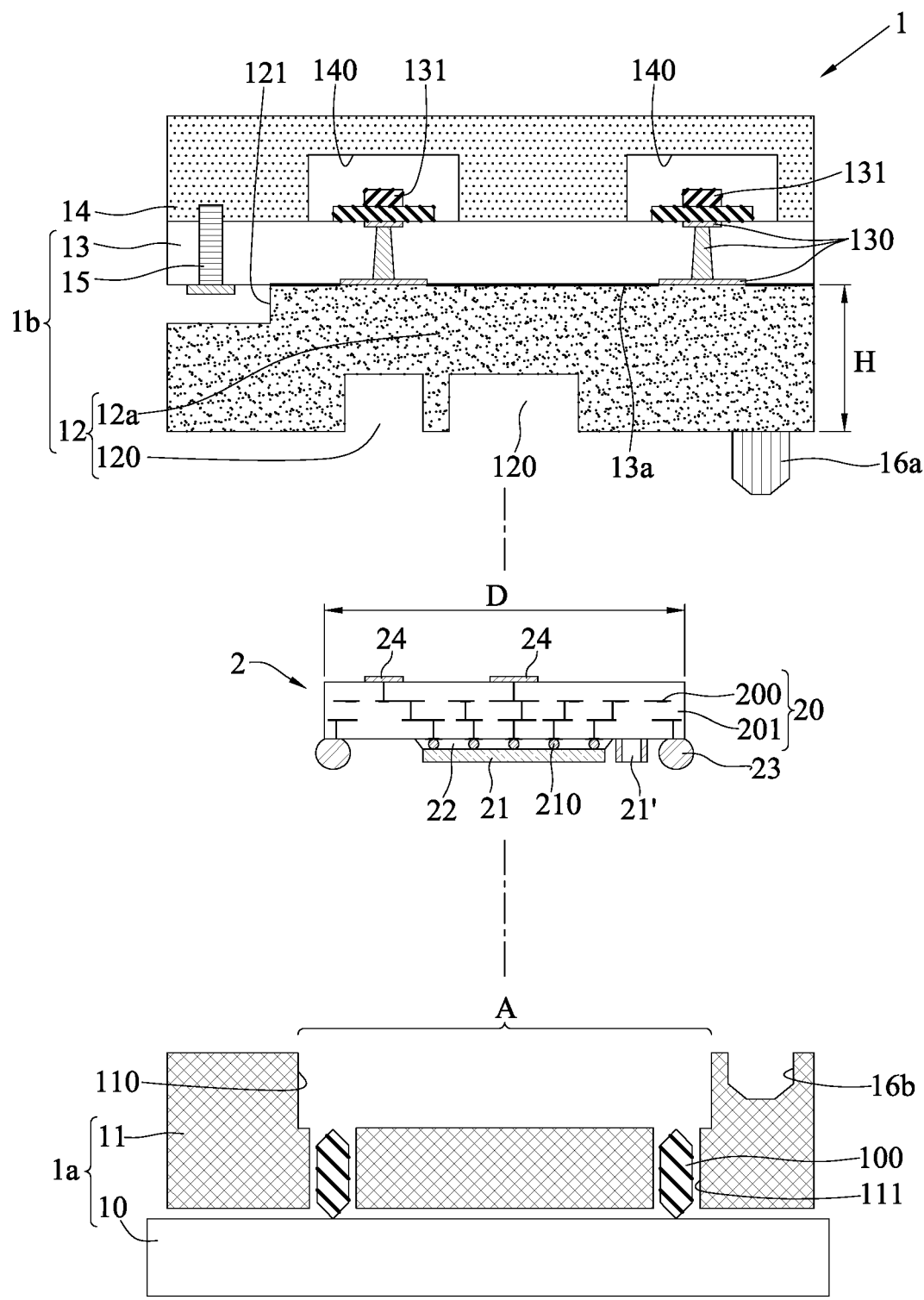
FIG. 1A is a cross-sectional view of a testing fixture of an embodiment according to the present invention.
Figure 1B:
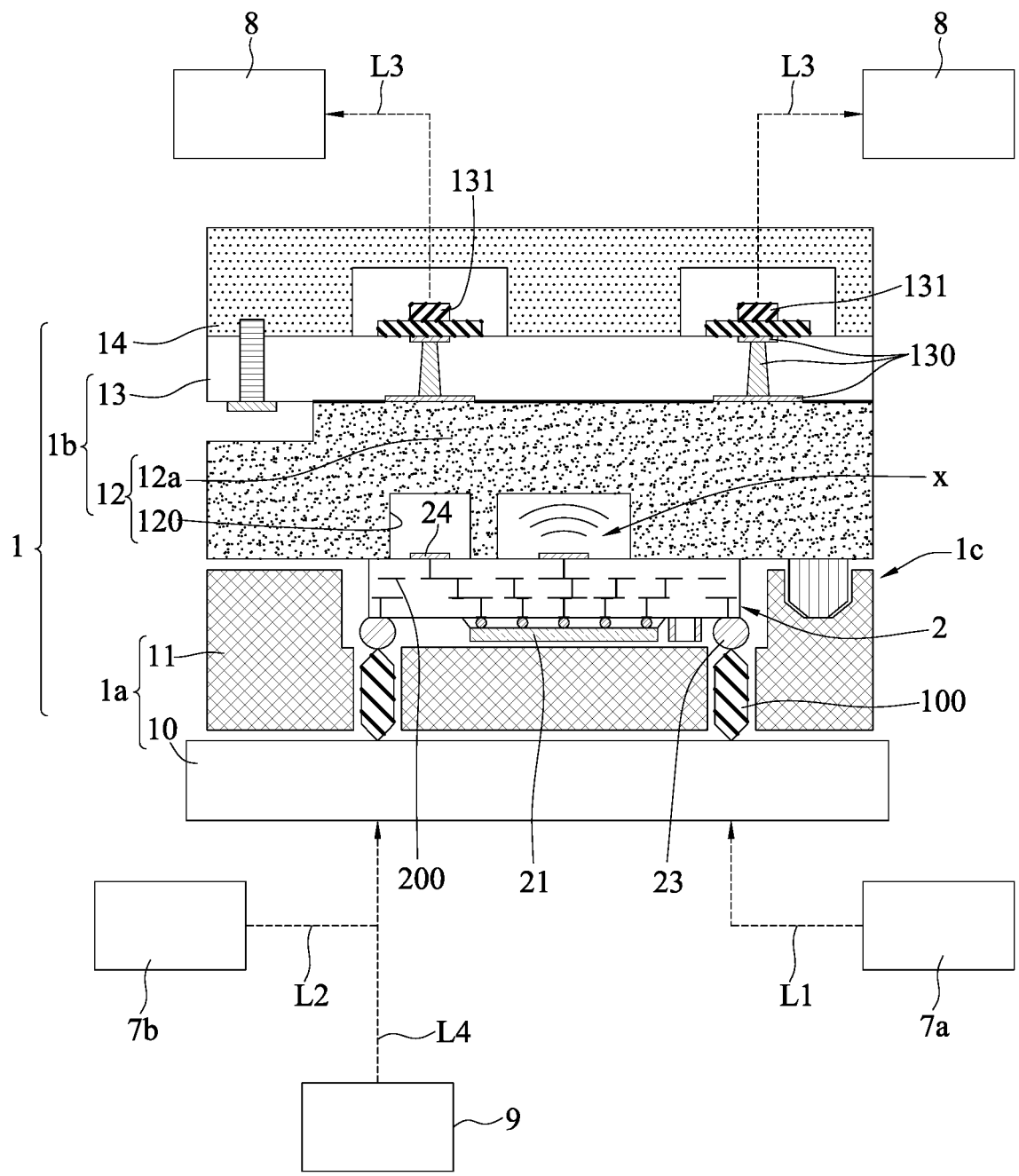
FIGS. 1B and 1C are cross-sectional views illustrating the operation of a testing fixture of an embodiment according to the present invention.

FIG. 1A is a cross-sectional view of a testing fixture 1 of an embodiment according to the present invention. FIG. 1B is a cross-sectional view illustrating the operation of the testing fixture 1 according to the present invention. The testing fixture 1 comprises a base unit 1a and a cover unit 1b disposed on the base unit 1a. The base unit 1a comprises a circuit board 10, and a seat body 11 disposed on the circuit board 10 and arranged with a plurality of conductive portions 100. The cover unit 1b comprises an interposing body 12 arranged with an interposing portion 12a and a plate body 13 bonded onto the interposing body 12. An externally connectible member 14 is disposed on the plate body 13.

The circuit board 10 is arranged with at least one layout (not shown) electrically connected to the conductive portions 100. The conductive portions 100 are in communicative connection via the layout with a first electronic device 7a, a second electronic device 7b and a fourth electronic device 9 (e.g., transmission paths L1, L2 and LA, denoted by dashed lines shown in FIGS. 1B and 1C).

In an embodiment, the conductive portions 100 are a probe structure, such as a pogo pin, a double-headed probe or other types, which can elastically move in the seat body 11 upward and downward.

The seat body 11 allows the cover unit 1b to be bonded thereonto and is arranged with a placing region A for at least one electronic structure 2 to be placed therein. The conductive portions 100 are disposed in the placing region A and elastically, electrically connected to the electronic structure 2 and the circuit board 10.

In an embodiment, the seat body 11 is formed with a groove 110 to act as the placing region A.

A plurality of through holes 111 corresponding to the conductive portions 100 are formed at a bottom portion of the groove 110 of the seat body 11. The conductive portions 100 pass through the through holes 111 and are exposed from the placing region A. The conductive portions 100 are arranged at the bottom portion of the groove 110. The electronic structure 2 is electrically connected to the conductive portions 100.

The electronic structure 2 acts as an object-to-be-tested. In an embodiment, the electronic structure 2 comprises a carrier 20, an electronic component 21, 21' disposed on the carrier 20, an encapsulating layer 22 encapsulating the electronic component 21, a plurality of conductive elements 23 electrically connected to the carrier 20, and a first antenna portion 24 disposed on the carrier 20.

In an embodiment, the carrier 20 is a packaging substrate having a core layer and a circuit structure or a coreless circuit structure. The carrier 20 comprises a dielectric material 201 and at least one circuit layer 200, such as a fan out redistribution layer (RDL), formed on the dielectric material 201. The carrier 20 can be other structures that carries a chip, such as a lead frame.

In an embodiment, the electronic component 21, 21' is an active component (e.g., the electronic component 21), such as a semiconductor chip, a passive component (e.g., the electronic component 21'), such as a resistor, a capacitor and an inductor, or a combination thereof. In an embodiment, the electronic component 21 is an mm Wave semiconductor chip, disposed on a bottom side of the carrier 20 via a plurality of conductive bumps 210, such as a solder tin material, and electrically connected to the circuit layer 200. In another embodiment, the electronic component 21 is electrically connected to the circuit layer 200 via a plurality of solder wires (not shown) in a wire bonding manner. In yet another embodiment, the electronic component 21, 21' is in direct contact with the circuit layer 200. However, the electronic component 21, 21' can be electrically connected to the carrier 20 in other manners.

In an embodiment, the encapsulating layer 22, such as an underfill, is formed on a bottom side of the carrier 20. In another embodiment, the encapsulating layer 22 is made of, but not limited to, polyimide (PI), a dry film, epoxy or a molding compound, and encapsulates the electronic component 21.

In an embodiment, the conductive elements 23 is a solder tin material, such as a metal pillar, such as a copper pillar, or other conductors, and is used to be in contact with the conductive portion 100.

The first antenna portion 24 is formed on a top side of the carrier 20. In an embodiment, the electronic structure 2 comprises a plurality of first antenna portions 24. The first antenna portions 24 are electrically connected to the electronic component 21 via the circuit layer 200. In an embodiment, a thin first antenna portion 24 can be fabricated by sputtering, vaporing, electroplating, electroless plating, chemically plating or foiling.

The cover unit 1b includes the interposing body 12 and the plate body 13. The interposing body 12 is bonded to the seat body 11 of the base unit 1a, and presses downward to fix the electronic structure 2. After the interposing body 12 is pressed down on the electronic structure 2, upper ends of the conductive portions 100 are connected to the conductive elements 23 of the electronic structure 2, and lower ends of the conductive portions 100 are connected to contact pads of the circuit board 10. The conductive portions 100 are elastic and will buffer and protect the conductive elements 23 or the electronic structure 2 from being damaged when the interposing body 12 presses the electronic structure 2 downward.

Figure 1C:
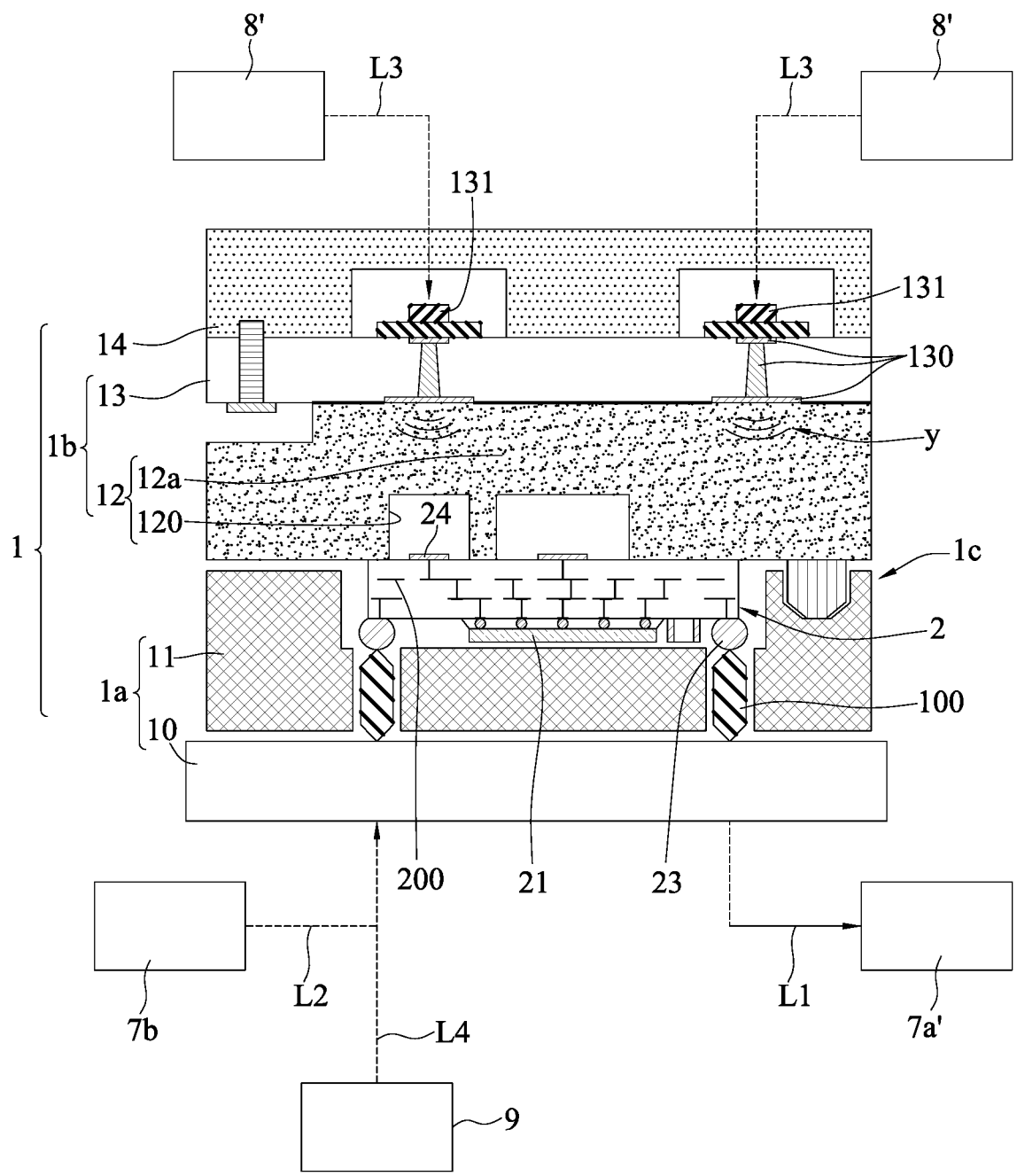

In an embodiment, the interposing body 12 is arranged with the interposing portion 12a and other parts (not shown). In another embodiment, the interposing portion 12a is made of a non-metal material, such as Teflon or an equivalent material having a low loss and a low dielectric constant (Dk), such as material with a dielectric constant within 1 to 3.2, in order to prevent from interfering electromagnetic waves x, y (as shown in FIG. 1C) (i.e., an antenna radiation signal).

Figure 2:
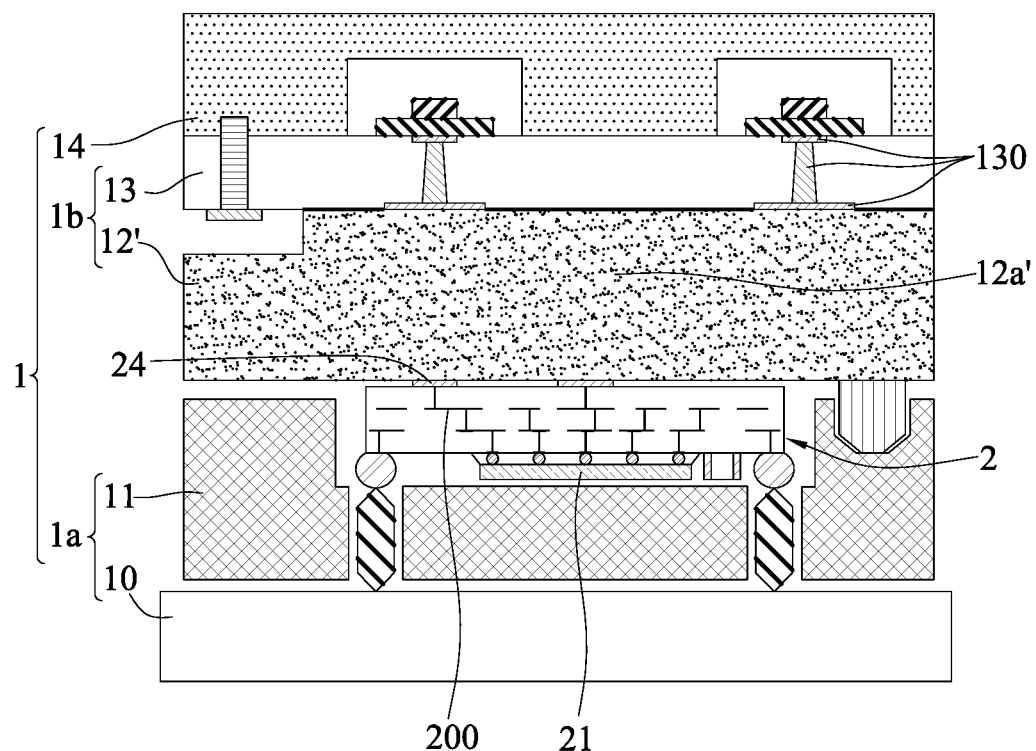
FIG. 2 is a cross-sectional view of a testing fixture of another embodiment according to the present invention.

The interposing body 12 has at least one concave portion 120 corresponding to the electronic structure 2 (or the first antenna portion 24). In an embodiment, the concave portion 120 of the interposing portion 12a corresponds to the first antenna portion 24 of the electronic structure 2 in position. In the interposing body 12' shown in FIG. 2, the interposing portion 12a' is not formed with a concave portion, and presses onto a whole top surface of the electronic structure 2 (or the first antenna portion 24) (e.g., a top surface of first antenna portion 24). With the design of the concave portion 120, the resistance of the first antenna portion 24 will not be affected, and a less effect will be on a load-pull of a power amplifier (PA) in the electronic structure 2. On the other hand, if the interposing portion 12a' is formed without the concave portion 120, the cover unit 1b will be fabricated easily and has a low fabrication cost, and the downward pressing force is even, which avoids the problem of measuring errors due to the askew of the electronic structure 2 in the testing fixture 1. Therefore, the concave portion 120 can be formed or not formed based on demands.

The interposing portion 12a extends in left and right directions in the figures and encompasses the whole seat body 11. In another embodiment, the interposing portion 12a can only correspond to a portion of the electronic component 21, and a part (not shown) can be disposed around the interposing portion 12a. Therefore, the interposing portion 12a has to be disposed between the first antenna portion 24 and a second antenna portion 130 (to be described hereafter), and a range of the interposing portion 12a disposed between the plate body 13 and the seat body 11 can be adjusted on demands.

The plate body 13 is an antenna board for testing, and has at least one second antenna portion 130 on a bottom side thereof corresponding to the first antenna portion 24 in position. The interposing portions 12a and 12a' of the interposing bodies 12 and 12' are spaced apart between the second antenna portion 130 of the plate body 13 and the seat body 11 (or the placing region A). In an embodiment, the plate body 13 has a plurality of second antenna portions 130.

In an embodiment, the plate body 13 is bonded via an adhesive material 13a to the interposing body 12. In an embodiment, the plate body 13 can be fabricated by a hard board, such as a general circuit board, or a soft board, such as a liquid crystal polymer, and is installed with a second antenna portion 130 that complies with the testing frequency band. In another embodiment, the adhesive material 13a is made of epoxy or other suitable materials.

The second antenna portions 130 are used in a testing process, such as a multi-input multi-output (MIMO) process, an antenna gain measuring (i.e., beam-forming) process, and a process for testing whether the adjusted angle of an antenna is correct (i.e., beam-steering). Therefore, the number of and the locations where the second antenna portions 130 are disposed can be designed in order to comply with the aspects of each testing condition. In an embodiment, a plurality of the second antenna portions 130 can be arranged to perform a multiple bandwidth testing process, and each of the second antenna portions 130 operates independently and is not in signal communication with other second antenna portions 130. In another embodiment, only a single second antenna portion 130 is arranged to conduct a single bandwidth testing. Therefore, an independent unit or an aspect of multiple sets can be designed on specification demands.

The second antenna portion 130 is in communicative connection with the third electronic device 8, 8'. In an embodiment, the plate body 13 has a plurality of switching elements 131 that are respectively electrically connected to the second antenna portions 130, and are in communicative connection with the third electronic device 8, 8' (e.g., the dashed-lined transmission path L3 shown in FIGS. 1B and 1C) via wires (e.g., a coaxial cable). The second antenna portions 130 are thus in communicative connection with the third electronic device 8, 8' via the switching elements 131. The switching element 131 can transmit signals having stable magnitudes and phases. In an embodiment, the switching element 131 is an adapter for adapting a coaxial wire to a circuit board (PCB) or an antenna board. A wire (e.g., a coaxial cable) that connects the switching element 131 with the third electronic device 8, 8' has to have phase stable and magnitude stable characteristics.

The externally connectible member 14 is detachably disposed on the cover unit 1b for being connected with at least one environment member (not shown) externally, and has receiving spaces 140 corresponding to the switching elements 131.

In an embodiment, the externally connectible member 14 is detachably connected to the plate body 13, and the plate body 13 or the externally connectible member 14 is replaceable in a modular manner based on specification demands. In an embodiment, the externally connectible member 14 is screwed to the plate body 13 by screws 15. The interposing body 12 is formed with a receiving space 121 (e.g., a recess fully or partially empty) corresponding to the screws 15 in position, allowing the screws 15 to be screwed in and out easily. In another embodiment, the externally connectible member 14 can be assembled with and detached from the plate body 13 in many others ways.

The externally connectible member 14 can be connected to an environment member, such as a pick and place handler. In an operation environment, a first pick and place handler places the electronic structure 2 in a placing region A of the seat body 11 and retreats, and a second pick and place handler moves to a region above the seat body 11, and actuates the externally connectible member 14 to drive the interposing body 12 to press the electronic structure 2 downward to a target position (or a limiting position). It should be understood that the externally connectible member 14 can cooperate with the environment member in many other ways.

The cover unit 1b can be disposed on the base unit 1a via the positioning structure 1c, for the second pick and place handler to move the interposing body 12 to the target position (or the limiting position). The relative position between the cover unit 1b and the base unit 1a after being positioned is associated with a width D and a testing bandwidth of the electronic structure 2.

The positioning structure 1c is a concave-convex structure. In an embodiment, the interposing body 12 is arranged with a block 16a (e.g., integrated with the interposing body 12), and the seat body 11 is arranged with a trench 16b (e.g., integrated with the seat body 11) corresponding to the block 16a, allowing the block 16a to be engaged with the trench 16b and the cover unit 1b be positioned on the base unit 1a. It should be understood that there are many types of the positioning structure 1c, and the block 16a and the trench 16b can be engaged with each other in other manners.

In an embodiment, the block 16a is a limiting position design, which corresponds to the trench 16b, and can position the interposing body 12 precisely in a horizontal direction to fix the radiation distance of the second antenna portion 130 and the first antenna portion 24 in the horizontal direction. The radiation distance will affect equivalent isotropically radiated power (EIRP) of the measured value. The vertical positioning can be controlled precisely through the vertical limiting positions of the block 16a and the trench 16b and the height H of the interposing portion 12a, 12a'. The height H of the interposing portion 12a, 12a' is a critical parameter. For objects-to-be-tested of the same kind of products, the testing fixture 1 has to have a consistent size in order to fix the radiation distance between the second antenna portion 130 and the first antenna portion 24 in the vertical direction (the radiation distance in the vertical direction will also affect the EIRP of the measured value).

The height H of the interposing body 12 must be greater than or equal to a far field distance d according to an equation H≥d=2D²/λ, where D is the maximum width of the electronic structure 2 (or the maximum width of the electronic component 21), and λ is a wavelength of an electromagnetic wave x, y in a testing frequency band. In other words, the height H of the interposing portion 12a, 12a' is associated with the width D of the electronic structure 2 (or the width of the electronic component 21) and the testing bandwidth λ.

In another embodiment (not shown), if a controller is used to control a downward displacement distance of the cover unit 1b, a mechanism for limiting a vertical displacement can be omitted, and only a mechanism for limiting horizontal displacement is required. If an image auxiliary system is used to align the cover unit 1b and the base unit 1a, both the mechanisms for limiting the vertical and horizontal displacements can be omitted. Therefore, the positioning structure 1c is not limited to those described above, and can be designed in various ways to meet a variety of demands.

As shown in FIG. 1B, when the testing fixture 1 is used to perform an electric testing process, the conductive elements 23 of the electronic structure 2 are in contact with the conductive portions 100 correspondingly. A portion of the conductive portions 100 is connected to a first electronic device 7a, such as a signal generator, to generate an intermediate frequency signal, i.e., providing an electronic signal mode of a simulation requirement specification. Another portion of the conductive portions 100 is connected to a second electronic device 7b (e.g., the dashed-lined transmission paths L2 shown in FIG. 1B), such as a phase-locked loop (PLL)/local oscillator testing machine to determine whether the current is conducted and monitor the frequency precision of a single harmonic wave signal generated by the electronic structure 2 (i.e., determining whether the frequency-mixing result of the electronic structure 2 complies with the needed specification, such as 28, 39, 71 GHz or other frequencies to determine whether the factors affecting the measurement are normal). Therefore, the conduction path of the electric testing process determines whether the electricity conditions of the electronic structure 2 are normal from the first electronic device 7a, the conductive portion 100 (the right side of the figure), the conductive elements 23 (the right side of the figure), the circuit layer 200 (the right side of the figure), the electronic component 21, the circuit layer 200 (the left side of the figure), the conductive elements 23 (the left side of the figure) and the conductive portion 100 (the left side of the figure) to the second electronic device 7b.

When the testing fixture 1 is used to conduct an antenna emission testing process of the electronic structure 2, the switching elements 131 are in communicative connection with a third electronic device 8, such as a signal analyzer, and a portion of the conductive portions 100 is in communicative connection with a fourth electronic device 9, such as a driving board (e.g., the dashed-lined transmission paths LA shown in FIG. 1B) to provide a control voltage via the wiring of the circuit board 10. Therefore, in the antenna testing process, signals will be input from the first electronic device 7a to the electronic structure 2 (e.g., the dashed-lined transmission paths L1 shown in FIG. 1B) and mixed by the electronic component 21 into the needed frequency specification (e.g., 28, 39, 71 GHz or other frequencies), the first antenna portions 24 emit electromagnetic waves x, the second antenna portions 130 receive corresponding electromagnetic waves x emitted by the corresponding first antenna portions 24, and the second antenna portions 130 transform the electromagnetic waves x into wired signals, the switching elements 131 transfer the wired signals into a coaxial cable and transmit them to the third electronic device 8 (e.g., the dashed-lined transmission paths L3 of FIG. 1B), by taking the coaxial cable as a transmission line. Therefore, the third electronic device 8 can analyze the complete wired signals to determine whether the electromagnetic waves x emitted by the electronic structure 2 comply with the requirement specification.

When the antenna receiving testing process of the electronic structure 2 is conducted, the emitting source and the receiving source can be switched in order to determine whether the receiving function of the electronic structure 2 is normal. As shown in FIG. 1C, a portion of the conductive portions 100 is in communicative connection to a fourth electronic device 9, such as a driving board (e.g., the dashed-lined transmission paths LA shown in FIG. 1C) to provide a control voltage via the wiring of the circuit board 10. The switching elements 131 are in communicative connection to a third electronic device 8', such as a signal generator to provide an mm Wave signal to the second antenna portion 130 (e.g., the dashed-lined transmission paths L3 shown in FIG. 1C) to allow the second antenna portion 130 to emit an electromagnetic wave y. The first antenna portion 24 of the electronic structure 2 receives the electromagnetic wave y, then the electronic component 21 processes the electromagnetic wave y. After the signal processing, the conductive elements 23 transmits an intermediate frequency signal to a first electronic device 7a', such as a signal analyzer (e.g., the dashed-lined transmission paths L1 shown in FIG. 1C) to determine whether the receiving function of the electronic structure 2 complies with the requirement specification.

Figure 3:
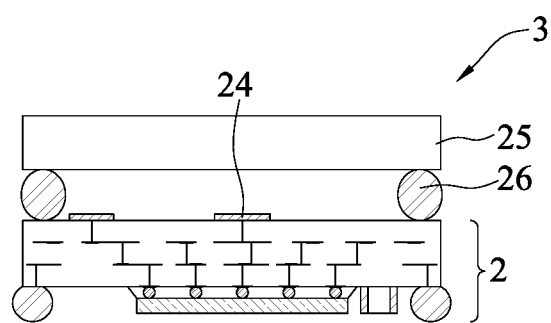
FIG. 3 is a cross-sectional view of a tested target of a testing fixture according to the present invention.

As shown in FIG. 3, an antenna board 25 is stacked on a top side of the electronic structure 2 via a solder tin material 26 to obtain another electronic package 3 having an OTA antenna structure (the antenna board 25 and the first antenna portion 24) to act as an object-to-be-tested. In an embodiment, the antenna board 25 and the first antenna portion 24 of the electronic package 3 use air as medium, and define an air region in a specific region therebetween (i.e., a region surrounded by the solder tin materials 26, without therein a filling material, such as a underfill or a molding material). It should be understood that the type of the object-to-be-tested is not limited to those described above.

In the testing fixture 1 according to the present invention, the cover unit 1*a* is disposed on the base unit 1*b* to perform an OTA antenna testing process and an electric testing process as well. Compared with the prior art, the testing fixture according to the present invention can meet the multiple-function testing requirement, and save the cost of the testing equipment effectively.

In the testing fixture 1 according to the present invention, through the design of the positioning structure 1*c* and the adjustment of the height H of the interposing portion 12*a*, 12*a'*, the measurement process can have repetitiveness and reproducibility and the measurement result is more precise and stable.

Since the interposing portion 12*a*, 12*a'* of the testing fixture 1 according to the present invention is made of a low-loss, low-Dk non-metal material, which does not affect an antenna radiation signal (an electromagnetic wave x, y) significantly, and a metal shielding effect will not occur.

The detachable design of the plate body 13 and the externally connectible member 14 of the testing fixture 1 enables convenient detachment and replacement. Therefore, the effect of replacing fixtures in a modular manner and cost reduce is achieved.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A testing fixture, comprising:
    a base unit including a placing region for an electronic structure having a first antenna portion to be placed therein and a conductive portion arranged in the placing region and configured for being electrically connected to the electronic structure; and
    a cover unit disposed on the base unit and including a second antenna portion associated with the first antenna portion in position and an interposing portion configured for separating the second antenna portion and the first antenna portion, the interposing portion being made of a non-metal material.

2. The testing fixture of claim 1, wherein a dielectric constant of the interposing portion is within 1 to 3.2.

3. The testing fixture of claim 1, wherein the cover unit has a concave portion corresponding to the electronic structure.

4. The testing fixture of claim 3, wherein the concave portion of the interposing portion corresponds to the first antenna portion of the electronic structure in position.

5. The testing fixture of claim 1, wherein the cover unit presses a whole top surface of the electronic structure.

6. The testing fixture of claim 1, wherein the cover unit includes a plate body arranged with the second antenna portion and an interposing body bonded to the plate body and arranged with the interposing portion.

7. The testing fixture of claim 6, wherein the plate body is bonded via an adhesive material to the interposing body.

8. The testing fixture of claim 1, wherein the second antenna portion is in communicative connection with an external electronic device.

9. The testing fixture of claim 8, wherein the cover unit further includes a switching element electrically connected to the second antenna portion, the second antenna portion is in communicative connection with the external electronic device via the switching element, and the switching element provides a signal transmission with a stable phase and a stable magnitude.

10. The testing fixture of claim 1, further comprising an externally connectible member detachably disposed on the cover unit and configured for an environment member to be connected thereto externally.

11. The testing fixture of claim 1, wherein a height of the interposing portion is associated with a width and a testing bandwidth of the electronic structure.

12. The testing fixture of claim 1, wherein the cover unit is disposed on the base unit via a positioning structure, and a relative position between the cover unit and the base unit after being positioned is associated with a width and a testing bandwidth of the electronic structure.

13. The testing fixture of claim 1, wherein the base unit includes:
    a circuit board; and
    a seat body disposed on the circuit board, arranged with the placing region and the conductive portion, and configured for the cover unit to be bonded thereto, and
    wherein the conductive portion is elastically, electrically connected to the electronic structure and the circuit board.

14. The testing fixture of claim 13, wherein the seat body is formed with a groove to act as the placing region, and the conductive portion is arranged in a bottom portion of the groove.

15. The testing fixture of claim 1, wherein the conductive portion is a probe structure.

* * * * *